US011770116B1

(12) United States Patent
Srinivasan Gopalan et al.

(10) Patent No.: US 11,770,116 B1
(45) Date of Patent: Sep. 26, 2023

(54) DUTY CYCLE CORRECTION FOR HIGH-SPEED CLOCK SIGNALS

(71) Applicant: Texas Instruments Incorporated, Dallas, TX (US)

(72) Inventors: Madusudanan Srinivasan Gopalan, Issaquah, WA (US); Robert Karl Butler, Issaquah, WA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/888,586

(22) Filed: Aug. 16, 2022

(51) Int. Cl.
 *H03K 3/017* (2006.01)
 *H03K 3/037* (2006.01)
 *H03K 5/05* (2006.01)
 *H03K 3/86* (2006.01)

(52) U.S. Cl.
 CPC ............. *H03K 3/017* (2013.01); *H03K 3/037* (2013.01); *H03K 3/86* (2013.01); *H03K 5/05* (2013.01)

(58) Field of Classification Search
 None
 See application file for complete search history.

(56) References Cited

U.S. PATENT DOCUMENTS

| | | | | |
|---|---|---|---|---|
| 8,242,850 B2 * | 8/2012 | Tsangaropoulos | ...... | H03L 1/027 331/74 |
| 10,141,942 B1 * | 11/2018 | Satoh | ........................ | H04L 5/26 |
| 10,218,343 B1 * | 2/2019 | Tomar | ..................... | G11C 7/222 |
| 10,320,376 B2 * | 6/2019 | Geiss | ................... | H03K 21/026 |
| 11,437,985 B1 * | 9/2022 | Vallet | ..................... | H03K 23/40 |
| 2013/0106479 A1 * | 5/2013 | Kim | ..................... | H03K 5/1565 327/175 |
| 2013/0207703 A1 * | 8/2013 | Bulzacchelli | ........ | H03K 17/005 327/164 |
| 2020/0220550 A1 * | 7/2020 | Aga | ..................... | H03L 7/0891 |
| 2022/0216860 A1 * | 7/2022 | Kimura | ..................... | G06F 1/10 |

OTHER PUBLICATIONS

Vazgen et al., "Duty-Cycle Correction Circuit for High Speed Interfaces," 2019 IEEE 39th Int'l Conf. on Elecs. and Nanotechnology (IEEE, 2019), pp. 42-45.

Qiu, et al., "1-5 GHz duty-cycle corrector circuit with wide correction range and high precision," Electronics Letters, vol. 50, No. 11 (IEEE, 2014), pp. 792-794.

* cited by examiner

*Primary Examiner* — Thomas J. Hiltunen
*Assistant Examiner* — Khareem E Almo
(74) *Attorney, Agent, or Firm* — Valerie M. Davis; Frank D. Cimino

(57) ABSTRACT

A duty cycle correction circuit, and method of operating the same, to correct the duty cycle of an input clock signal having a frequency divided-down from a reference clock by an odd-valued integer. A delay stage outputs the input clock signal delayed by one half-cycle of the reference clock, and a logic circuit outputs an extended clock signal by a logical OR of the input and delayed clock signals. A latch latches the extended clock signal when enabled by the reference clock, and a flip-flop latches the extended clock signal responsive to the reference clock. A gate selects the latch output or the flip-flop output based on the state of the delayed clock signal as an intermediate signal. A multiplexer generates the output clock by selecting between the intermediate signal and the input clock signal in alternating reference clock phases.

19 Claims, 8 Drawing Sheets

DUTY CYCLE CORRECTION FOR HIGH-SPEED CLOCK SIGNALS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This relates to the generation of clock signals in an integrated circuit, and more specifically relates to duty cycle correction of such clock signals.

Many modern electronic systems include one or more integrated circuits that operate synchronously, both internally and among one another, based on a number of clock signals, often of various frequencies and phase relationships. These clock signals are commonly generated from a reference clock signal, which may be either externally provided or generated by one of the system integrated circuits. Circuits and devices to be synchronized with one another may have their specific clock signals based on the same reference clock signal. Even so, as operating speeds and frequencies continue to increase with improvements in the capabilities of integrated circuits, constraints on clock parameters such as noise, jitter, duty cycle stability, and the like have become more stringent.

One particular system application in which accurate high speed clock distribution is especially critical is serial data communication between integrated circuits. Serial interfaces have become especially attractive for data communication between data converters such as analog-to-digital converters (ADCs) and digital-to-analog converters (DACs), on one hand, and logic devices such as field-programmable gate arrays (FPGAs) or application-specific integrated circuits (ASICs), on the other hand. In contrast to parallel data interfaces, serial interfaces reduce the number of conductors in the interface and thus reduce and simplify circuit board area, reduce the package sizes of the integrated circuits, and are readily scalable to higher data rates. High-speed serial interface standards have been adopted in the industry, one example of which is low voltage differential signaling (LVDS) standard TIA/EIA-644 promulgated by the Telecommunications Industry Association (TIA) and the Electronics Industries Alliance (EIA).

Another serial interface standard that is proving to be particularly useful for interfaces between data converters and logic devices has been promulgated by the Joint Electron Devices Engineering Council (JEDEC) as JEDEC standard (JESD) JESD204A, JESD204B, and JESD204C. The JESD204 standards provide serial data rates of up to 12.5 gigabits per second (Gbps) while achieving deterministic latency across the serial links. A common JESD204B/C implementation includes a clock generator circuit, such as a digital phase-locked loop (DPLL), which generates a reference clock signal (synonymously, "reference clock") from which device clocks and system reference signals are generated for devices in the system that support a serial interface. For example, eight devices in the system may reside in a single clock or DPLL "domain," in which device clocks and system reference signals for those eight devices are based on the same reference clock (e.g., the clock output from one PLL).

DPLLs typically include a voltage controlled oscillator that is controlled in phase-locked fashion to generate a high-speed clock signal. In many implementations, the DPLL uses one or more frequency dividers to reduce the frequency of the high-speed VCO output clock to the desired frequency. For example, a first frequency divider may divide down the frequency of the VCO output clock by a factor of four or eight, followed by a second multi-modulus frequency divider that further divides down the frequency by a selected integer value to produce the desired lower-frequency clock.

Many applications, such as those systems including high-speed LVDS or JESD204 serial interfaces, require clock signals to have a 50% duty cycle. Dividing down a 50% duty cycle VCO clock output by the DPLL by an even-valued integer naturally produces the desired 50% duty cycle output clock. However, if the divide ratio applied to the VCO output clock is an odd-valued integer, the duty cycle of the output clock will not necessarily be at 50%. For example, frequency division of a 50% duty cycle clock by a factor of 3 will commonly result in an output clock with a 33% duty cycle (e.g., a high level phase for one VCO output clock cycle, followed by a low level phase for two VCO output clock cycles). Other odd-valued divide ratios will also typically produce a clock signal in which the high level and low level phases will differ in length by one VCO output clock cycle. Conventional clock generation subsystems often include a duty cycle correction circuit following the DPLL frequency dividers to correct the duty cycle of the frequency-divided clock to 50%, for example by lengthening the duration of the high-level phase by one half of a VCO output clock cycle (at the expense of the low-level phase). In the JESD204 context, the 50% duty cycle corrected clock is forwarded as the reference clock signal to clock generators for producing the device clocks and system reference signals.

FIG. 1A illustrates the construction of a PLL subsystem including a conventional duty cycle correction circuit 100. In this conventional example, DPLL 101 generates a high-speed VCO clock HS_CLK. Frequency divider 102 receives a reference clock HS_CLK generated by DPLL 101 at its input, and divides down the frequency of reference clock HS_CLK by a selected integer multiple to produce clock DCC_IN at its output. For purposes of this example, the frequency of clock DCC_IN is divided down from the frequency of reference clock HS_CLK by a factor of three. However, because the divide ratio of three applied by frequency divider 102 is odd-valued, the duty cycle of clock DCC_IN is not 50% as desired, but 33%. Duty cycle correction circuit 100 has an input receiving clock DCC_IN from frequency divider 102, and is called upon to generate an output clock PLLCLK at the same frequency as clock DCC_IN, but with a 50% duty cycle.

Conventional duty cycle correction circuit 100 includes clocked buffer 104 receiving clock DCC_IN at an input. When clocked by a rising edge of reference clock HS_CLK, buffer 104 forwards the level of clock DCC_IN as signal R1. (In this description, all references to a signal "level" refer to a logic level of the signal; e.g., at a "0" or "1" level, or alternatively a "low" or a "high" logic level.) Similarly, clocked buffer 106 receives signal R1 at an input, and when clocked by a rising edge of reference clock HS_CLK, forwards the level of signal R1 as signal R2. Signal R2 is applied to one input of multiplexer 110.

Signal R1 from clocked buffer 104 is applied to one input of OR gate 114 and to an input of latch 112. Latch 112 is a D-type latch with reference clock HS_CLK as an enable signal, and in this conventional example is configured to respond to its input (signal R1) while HS_CLK is at a low level. The output of latch 112 is connected to a second input of OR gate 114, which thus receives delayed signal R1D from latch 112. The output of OR gate 114, presenting signal OR_OUT, is connected to the D input of D-type edge-triggered flip-flop 116. Flip-flop 116 is triggered by the falling edge of reference clock HS_CLK to latch the level of signal OR_OUT at that time, and to output an intermediate signal F2 corresponding to its latched state. The output of flip-flop 116 is connected to a second input of multiplexer 110. Multiplexer 110 has a select input receiving reference clock HS_CLK, in response to which it generates output clock PLLCLK from its selected input. In this case, multiplexer 110 forwards the level of signal R2 from the output of flip-flop 116 as output clock PLLCLK when reference clock HS_CLK is low (at a "0" level) and forwards intermediate signal F2 to its (output clock PLLCLK) when clock HS_CLK is high (at a "1" level).

The operation of conventional duty cycle correction circuit 100 is illustrated in FIG. 1B. As shown in FIG. 1B, signal R1 output by clocked buffer 104 corresponds to clock DCC_IN delayed by one cycle of reference clock HS_CLK, and signal R2 output by clocked buffer 106 corresponds to clock DCC_IN delayed by two cycles of reference clock HS_CLK (e.g., signal R1 delayed by one cycle of HS_CLK). Because latch 112 is enabled when reference clock HS_CLK is at a low level, latch 112 generates delayed signal R1D, which corresponds to signal R1 delayed by one half-cycle of reference clock HS_CLK. OR gate 114 presents a high level at its output, as signal OR_OUT, in response to either or both of signal R1 and delayed signal MD being high. As such, the combination of latch 112 and OR gate 114 operate to lengthen the duration of the high level of signal R1, relative to clock DCC_IN, by one half-cycle of reference clock HS_CLK. Upon the next falling edge of reference clock HS_CLK (e.g., falling edge F2), flip-flop 116 outputs intermediate signal F2 at a high level, for application to multiplexer 110.

To generate output clock PLLCLK, multiplexer 110 selects between signal R2 and intermediate signal F2 depending on the level of reference clock HS_CLK. In the example of FIG. 1B, for example, the high level of intermediate signal F2 produced by flip-flop 116 is selected for output clock PLLCLK after rising edge RE3, the high level of signal R2 from buffer 106 is selected for output clock PLLCLK after the next falling edge FE3, and the high level of intermediate signal F2 produced by flip-flop 116 is selected after the next rising edge RE4. At the time of the next falling edge FE4, signal R2 from buffer 106 has returned to a low level as intermediate signal F2, which is selected by multiplexer 110 as the level of clock PLLCLK. This operation continues, resulting in output clock PLLCLK having the same frequency as clock DCC_IN received by duty cycle correction circuit 100, but at a 50% duty cycle.

A critical timing in this conventional duty cycle correction circuit 100 is the rising edge of intermediate signal F2 at the time of falling edge FE2. In order for the corrected output signal PLLCLK to be generated at the correct frequency and duty cycle, signal OR_OUT must be at a valid high level by the time at which flip-flop 116 is triggered by falling edge FE2. However, the implementation of circuit 100 in practice requires consideration of certain non-idealities. As shown in FIG. 1B, the rising edge of signal OR_OUT is typically delayed from the rising edge RE2 of reference clock HS_CLK by a delay δ that includes a propagation delay $t_{clk\text{-}q}$ of buffer 104 and also the propagation delay $t_{OR}$ of OR gate 114. In addition, to ensure validity of the high level of signal OR_OUT to be latched into flip-flop 116, that high level must be present and valid at a setup time $t_{su}$ prior to the falling edge FE2 of reference clock HS_CLK.

The sum of delay δ and setup time $t_{su}$ effectively establishes a limit of the frequency of reference clock HS_CLK. For example, circuits implemented with modern-day technology may exhibit a typical value of propagation delay $t_{clk\_q}$ of 20 psec and a propagation delay $t_{OR}$ of 25 psec, while a setup time $t_{su}$ of 10 psec is typically required at flip-flop 116. In this example, those timings limits the period of a half-cycle of reference clock HS_CLK to no shorter than 55 psec. The limiting signal path of conventional duty cycle correction circuit 100 is thus referred to as a "half-cycle" path, in that the critical timings must be accounted for within a half-cycle of the highest-speed clock. For this example, the maximum frequency of reference clock HS_CLK is limited to 9.1 GHz, without margin for aging and other performance effects.

As mentioned above, the JESD204 standards provide serial data rates of up to 12.5 gigabits per second (Gbps). Accordingly, the limitation on the clock rate of the reference clock HS_CLK necessitated by conventional duty cycle correction circuit 100, for example to 9.1 GHz in the example noted above, falls short of the desired performance for modern integrated circuits.

It is within this context that the embodiments described herein arise.

BRIEF SUMMARY OF THE INVENTION

According to one aspect, a duty cycle correction circuit is provided to correct the duty cycle of an input clock signal having a frequency divided-down from a reference clock by an odd-valued integer. The circuit includes a delay stage configured to output a delayed clock signal corresponding to the input clock signal delayed by one half-cycle of the reference clock, and a logic function configured to output an extended clock signal corresponding to a logical OR of the input clock signal and the delayed clock signal. A latch circuit latches the state of the extended clock signal when enabled by the reference clock, and a flip-flop latches the state of the extended clock signal responsive to a transition of the reference clock. A gate function is configured to selectively output a selected one of the output of the latch and the output of the flip-flop responsive to a state of the delayed clock signal as an intermediate signal. A multiplexer generates the output clock signal by selecting the intermediate signal and the input clock signal in alternating phases of the reference clock.

According to another aspect, clock circuitry includes reference clock circuitry generating a reference clock, a frequency divider generating an input clock signal having a divided-down from a reference clock by an odd-valued integer, and a duty cycle correction circuit. The duty cycle correction circuit includes a delay stage configured to output a delayed clock signal corresponding to the input clock signal delayed by one half-cycle of the reference clock, and a logic function configured to output an extended clock signal corresponding to a logical OR of the input clock signal and the delayed clock signal. A latch circuit latches the state of the extended clock signal when enabled by the reference clock, and a flip-flop latches the state of the extended clock signal responsive to a transition of the reference clock. A gate function is configured to selectively output a selected one of the output of the latch and the output of the flip-flop responsive to a state of the delayed clock signal as an intermediate signal. A multiplexer generates the output clock signal by selecting the intermediate signal and the input clock signal in alternating phases of the reference clock.

According to another aspect, a method of duty cycle correction is provided to correct the duty cycle of an input clock signal having a frequency divided down from the frequency of a reference clock by an odd-valued integer. The method includes delaying the input clock signal by a half-cycle of the reference clock to produce a delayed signal, and combining the input clock signal with the delayed signal to produce an extended clock signal. At a latch circuit, the extended clock signal is latched during a first phase of the reference clock, and output during a second phase of the reference clock. At an edge-triggered flip-flop, the extended clock signal is latched responsive to a transition of the reference clock to the first phase, and output until a next transition of the reference clock to the first phase. An intermediate signal is generated by alternately selecting between the output of the latch circuit and the output of the flip-flop, and an output clock is generated from this intermediate signal.

Technical advantages enabled by one or more of these aspects include relaxing of the timing of an extended version of the input clock signal in the generation of a corresponding output clock, by providing a "full cycle" path in the duty cycle correction circuit. The ability to operate at a higher reference clock frequency and a low noise level is enabled.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF THE INVENTION

The one or more embodiments described in this specification are implemented into clock generation circuitry, for example as used for JESD204B/C serial interfaces between integrated circuits, as it is contemplated that such implementation is particularly advantageous in that context. However, it is also contemplated that aspects of these embodiments may be beneficially applied in other applications, including electronic systems of various types as may be used in computing and communications applications, among others. Accordingly, it is to be understood that the following description is provided by way of example only, and is not intended to limit the true scope of this invention as claimed.

Figure 2:
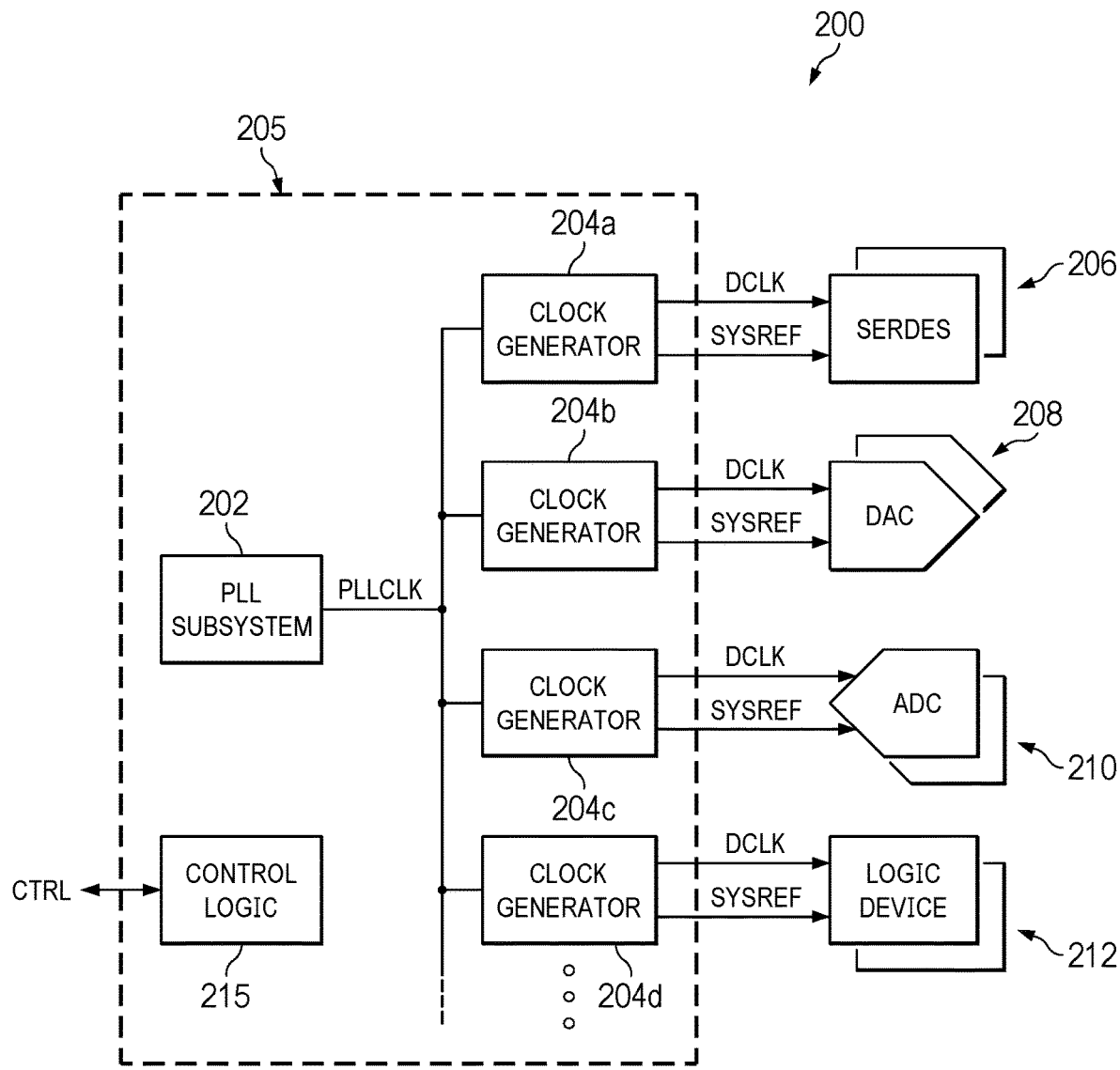
FIG. 2 is an electrical diagram, in block form, of at least a portion of an electronic system in which example embodiments may be implemented.

FIG. 2 illustrates the architecture of at least a portion of an electronic system 200 into which example embodiments may be implemented. In a general sense, system 200 represents a clock "domain" that includes one or more integrated circuits. Each of the integrated circuits in the clock domain receives one or more clock signals based on the same PLL output clock PLLCLK, in this case as generated from the same phase-locked loop (PLL) subsystem 202. System 200 may include multiple clock domains (where each may be similar to that shown in FIG. 2), each such clock domain with one or more clock signals generated from an associated common reference clock source such as a PLL.

For the clock domain of system 200 shown in FIG. 2, PLL subsystem 202 generates PLL output clock PLLCLK, upon which the clocking of multiple integrated circuit functions is based, for example to facilitate data communication among these functions. For example, system 200 of FIG. 2 may correspond to a JESD204B/C system. In this example, clock generators 204a, 204b, 204c, 204d, etc. (generically referred to as clock generator or generators 204) are provided in the same clock domain of system 200, and as such each clock generator 204 has an input receiving PLL output clock PLLCLK from PLL subsystem 202. For JESD204B/C communications, PLL output clock PLLCLK may have a relatively high frequency, such as on the order of several GHz. Clock generators 204 in this example each generate one or more clock signals based on PLL output clock PLLCLK, including one or more device clocks DCLK and a system reference signal SYSREF. For the example of JESD204B/C, a device clock corresponds to a clock signal at a frequency divided down from PLL output clock PLLCLK, based upon which various circuit functions within an integrated circuit function may be clocked. Under JESD204B/C, a system reference signal is a clock signal that is generally at a lower frequency than device clocks (e.g., further divided down from PLL output clock PLLCLK by clock generators 204) and used for synchronizing framing among the various circuit functions within the same clock domain of system 200 (e.g., according to subclass 1 of the JESD204B standard). To facilitate such synchronization, the individual system reference signals SYSREF generated by each of clock generators 204a through 204d may all be at the same frequency, for example having a period that is the lowest common multiple of the periods of the various device clocks DCLK.

Control logic 215 may also be included in system 200 in connection with clock generators 204. For example, control logic 215 may receive control signals CTRL from a controller or other logic circuitry (e.g., either or both internal or external to system 200), such control signals indicating a desired frequency relationship among the various device clocks DCLK and system reference signals SYSREF. In response, control logic 215 may store configuration or control words, for example in a control register, and may communicate control signals to clock generators 204 to set the appropriate frequencies and phase relationships. Control logic 215 may additionally operate to reset all clock generators 204 in a given clock domain, for example in response to receiving a reset code or signal over control signals CTRL.

In some examples, PLL subsystem 202 and clock generators 204, as well as control logic 215, may be implemented into a single integrated circuit, for example as shown in FIG. 2 by clock generator device 205. In such a device, PLL subsystem 202 may interface to an external crystal oscillator, or alternatively may include a integrated voltage-controlled oscillator. In either case, the oscillator output of PLL subsystem 202 is distributed within clock generator device 205 to individual clock generators 204. While FIG. 2 specifically illustrates four clock generators 204a through 204d, more or fewer clock generators 204 may be provided for this clock domain.

FIG. 2 illustrates various examples of integrated circuit functions receiving clock signals generated by clock generators 204. In this implementation, one or more serializer/deserializer (SERDES) circuits 206 receive device clock DCLK and system reference signal SYSREF from clock generator 204a, one or more digital-to-analog converters (DACs) 208 receive device clock DCLK and system reference signal SYSREF from clock generator 204b, one or more analog-to-digital converters (ADCs) 210 receive device clock DCLK and system reference signal SYSREF from clock generator 204c, and one or more logic devices 212 receive device clock DCLK and system reference signal SYSREF from clock generator 204d. Integrated circuit functions 206, 208, 210, 212 may each be implemented in separate integrated circuits, or alternatively some of these functions may be fabricated to reside in the same integrated circuit as one another, or with clock generator device 205. The one or more logic devices 212 may, for example, be implemented as field-programmable gate array (FPGA) devices or application-specific integrated circuits (ASICs). As noted above, the clock generation arrangement of FIG. 2 may support data communications among the various integrated circuit functions 206, 208, 210, 212 according to the JESD204B/C standards, in which case serial interfaces will be provided among those functions.

Figure 3:
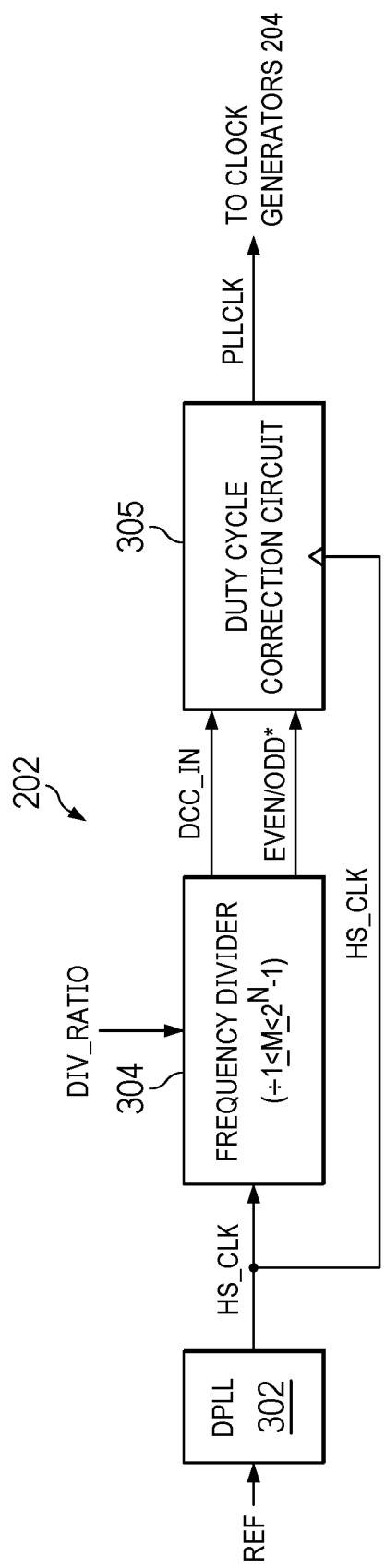
FIG. 3 is an electrical diagram, in block form, of a phase-locked loop (PLL) subsystem in which example embodiments may be implemented.

FIG. 3 illustrates the generalized construction of PLL subsystem 202 in which example embodiments may be implemented. In this example, PLL subsystem 202 includes digital phase-locked loop (DPLL) 302, which may be constructed in the conventional manner to generate high-speed reference clock HS_CLK. The frequency of high-speed reference clock HS_CLK may be controllable, for example by a reference signal REF applied to DPLL 302. Reference signal REF may take any one of a number of forms, including for example an analog level (e.g., a reference voltage or current level), or a periodic signal based on an external crystal oscillator or otherwise provided to PLL subsystem 202 from an external device or integrated circuit. Especially in systems that include high-speed serial data interfaces, such as the JESD204A/B/C standards noted above, reference clock HS_CLK may have a frequency on the order of several GHz.

Reference clock HS_CLK output by DPLL 302 is received at an input of frequency divider 304. Frequency divider 304 divides down the frequency of reference clock HS_CLK by a selected divide ratio to produce clock DCC_IN at that divided-down frequency at its output. In this example, the divide ratio applied by frequency divider 304 is an integer, for example as indicated by control signal DIV_RATIO provided by an external controller or other system function. Alternatively, the divide ratio may be pre-programmed or stored in frequency divider 304, for example in a control register or other memory location. Divide ratio in this example may take any integer value M over a range of 1 to 2' inclusive, where N is a preselected bit width (e.g., the bit width of digital control signal DIV_RATIO).

In some implementations, frequency divider 304 may be implemented by two or more frequency divider circuits in series. For example, a first frequency divider may divide down reference clock HS_CLK by a fixed divide ratio of 4 or 8, followed by a second frequency divider that divides down the output of the first frequency divider by a selectable integer ratio (which may be even- or odd-valued), as may be indicated by control signal DIV_RATIO, to produce clock DCC_IN. Other implementations of frequency divider 304 are contemplated.

The output of frequency divider 304 is coupled to an input of duty cycle correction circuit 305, which is constructed and operates to correct the duty cycle of clock DCC_IN, if necessary (e.g., due to an odd-valued divide ratio applied by frequency divider 304), typically to 50%. In this example implementation, as will be described below, certain circuits in duty cycle correction circuit 305 are clocked by reference clock HS_CLK, which is forwarded from the output of DPLL 302 to one or more clock inputs of duty cycle correction circuit 305. Also in this implementation, control signal EVEN/ODD* is coupled from frequency divider 304 or from control signal DIV/RATIO itself (e.g., the LSB of the integer value) to a control input of duty cycle correction circuit 305, to indicate whether the divide ratio applied by frequency divider 304 is odd-valued or even-valued. As noted above, duty cycle correction may not be necessary in those cases in which the divide ratio applied by frequency divider 304 is even-valued. Duty cycle correction circuit 305 has an output at which presents output clock PLLCLK for forwarding to other circuits in the system, such as clock generators 204 in clock generator device 205 of FIG. 2.

Figure 4:
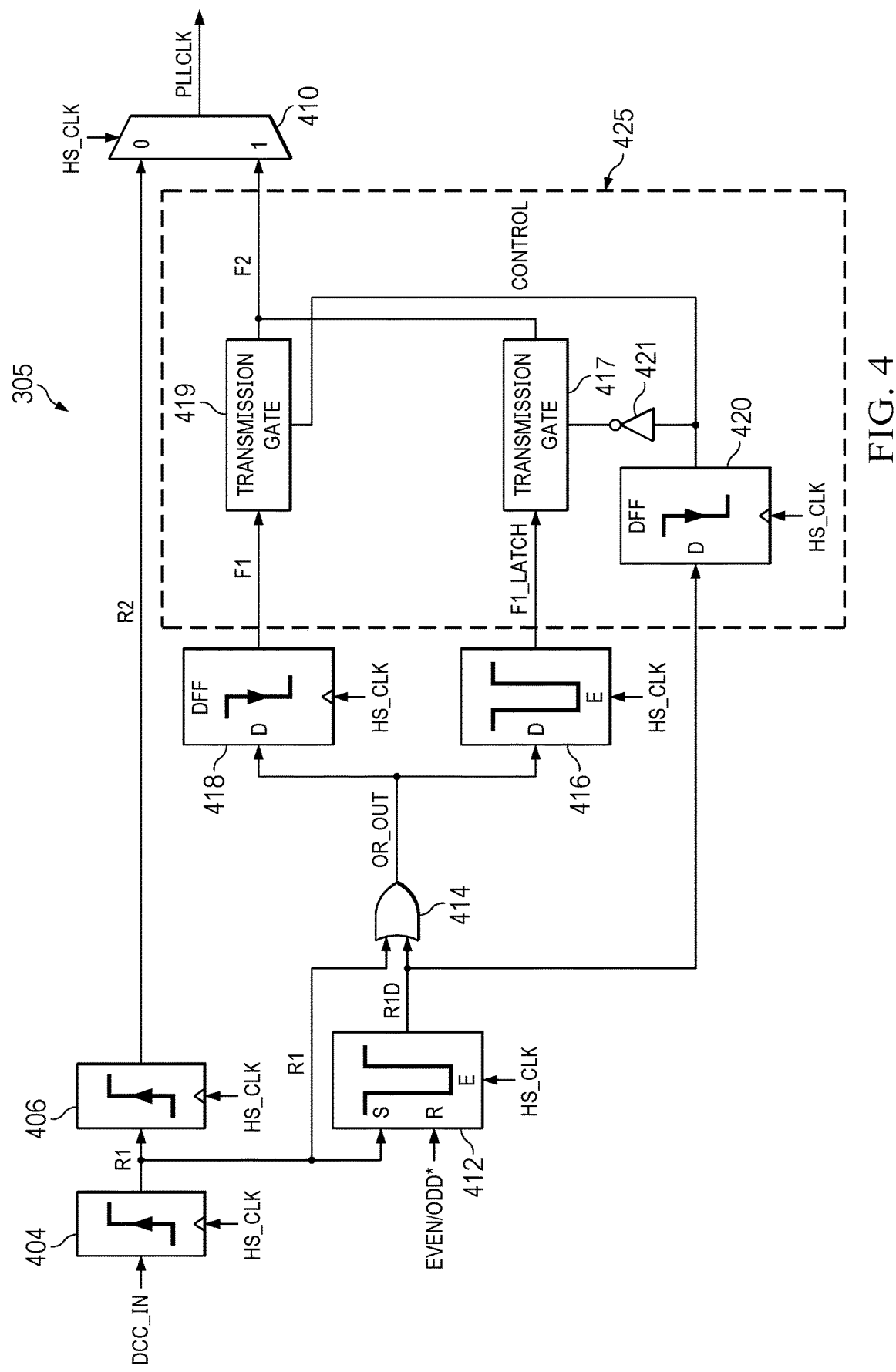
FIG. 4 is an electrical diagram, in block and schematic form, of a duty cycle correction circuit according to an example embodiment.

FIG. 4 illustrates the construction of duty cycle correction circuit 305 according to an example embodiment, as it may be implemented into PLL subsystem 202 of FIG. 3. Duty cycle correction circuit 305 includes clocked buffer 404, which has an input receiving clock DCC_IN from frequency divider 304, a clock input receiving high speed clock HS_CLK from DPLL 302, and an output. In response to a rising edge of reference clock HS_CLK at its clock input, buffer 404 presents the level of clock DCC_IN at its output as signal R1. Clocked buffer 406 has an input coupled to the output of buffer 404 to receive signal R1, a clock input also receiving high speed clock HS_CLK from DPLL 302, and an output. In response to a rising edge of reference clock HS_CLK at its clock input, buffer presents the level of signal R1 at its output as signal R2. The output of buffer 406 is coupled to one input of multiplexer 410, which has a select input receiving reference clock HS_CLK.

The output of clocked buffer 404 is also coupled to one input of a logic function (e.g., an OR gate) 414 and to an input of a delay stage, which in this example is implemented as latch 412. Latch 412 can be considered as a R—S type latch with an R input receiving control signal EVEN/ODD* from frequency divider 304, an S input receiving signal R1 from buffer 404, and an enable input receiving reference clock HS_CLK from DPLL 302. Latch 412 has an output at which it presents its latched state as signal IUD to a second input of OR gate 414. For the case in which the divide ratio applied by frequency divider 304 is even-valued, control signal EVEN/ODD* is at an active (e.g., high) logic level in this example, which places latch 412 into a reset state in which its output (signal R1D) is forced to a low logic level regardless of the state of signal R1. For the case in which the divide ratio applied by frequency divider 304 is odd-valued, control signal EVEN/ODD* at the R input of latch 412 is at an inactive (e.g., low) level in this example, enabling latch 412 to respond to signal R1. For the case of an odd-valued divide ratio, and during negative phases of reference clock HS_CLK (e.g., HS_CLK at a low logic level), latch 412 latches the logic level of signal R1 at its S input and presents that latched state at its output as signal R1D.

OR gate 414 of duty cycle correction circuit 305 has one input coupled to the output of buffer 404 to receive signal R1, another input coupled to the output of latch 412 to receive delayed signal R1D, and an output at which it presents signal OR_OUT. The output of OR gate 414 is coupled to the D input of D-type latch 416. D-type latch 416 has an enable input coupled to DPLL 302 to receive reference clock HS_CLK, and an output at which it presents its latched state as signal F1_LATCH to one side of transmission gate 417. The other side of transmission gate 417 in this example is coupled to an input of multiplexer 410, as intermediate signal F2.

Figure 5A:
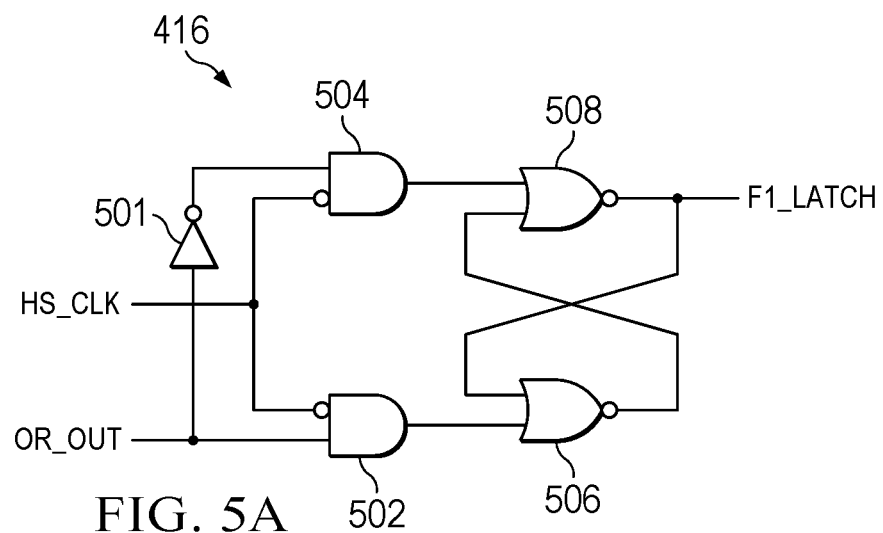
FIG. 5A is an electrical diagram, in schematic form, of a D-type latch circuit in the duty cycle correction circuit of FIG. 4 according to an example embodiment.

FIG. 5A illustrates an example of an arrangement of D-type latch 416. AND gate 502 has a first input receiving signal OR_OUT and a second, inverting, input coupled to DPLL 302 to receive reference clock HS_CLK. Signal OR_OUT is coupled via inverter 501 to a first input of AND gate 504. AND gate 504 has a second, inverting, input coupled to DPLL 302 to receive reference clock HS_CLK. An output of AND gate 502 is coupled to one input of NOR gate 506, and an output of AND gate 504 is coupled to one input of NOR gate 508. NOR gates 506 and 508 are cross-coupled, with the output of each coupled to an input of the other. The output of NOR gate 508 serves as the output of D-type latch 416, presenting signal F1_LATCH.

In operation, D-type latch 416 is enabled while reference clock HS_CLK is at a low level, in that AND gates 502 and 504 are then operable to respond to the level of signal OR_OUT. In this condition, signal F1_LATCH at the output of NOR gate 508 will correspond to the level of signal OR_OUT at the input of AND gate 502, through the operation of NOR gate 506. The inverted level of signal OR_OUT at the input of AND gate 504 will result in a low level at the output of AND gate 504. Accordingly, as signal R1 transitions from a low level to a high level while reference clock HS_CLK is low, signal F1_LATCH at the output of NOR gate 508 will similarly transition from a low level to a high level. Conversely, as signal R1 transitions from a high level to a low level while reference clock HS_CLK is low, AND gate 504 will present a high level at its output to NOR gate 508, causing signal F1_LATCH at the output of NOR gate 508 to also transition to a low level.

Other alternative implementations of D-type latch 416 are also contemplated, in each such case configured and operable to latch and output, while reference clock HS_CLK is at a given level (e.g., a low logic level), a logic level corresponding to the level at its input receiving signal OR_OUT. Similarly, alternative logic functions to OR gate 414 for combining signals R1 and R1D (e.g., a NAND function) may instead be used, depending on the phase and logic conventions and other implementation considerations.

Referring back to FIG. 4, the D input of D-type edge-triggered flip-flop 418 is also coupled to the output of OR gate 414 to receive signal OR_OUT. In this example, flip-flop 418 is triggered by the falling edge of reference clock HS_CLK to store the state then at its D input and to present that stored state at an output as signal F1. This output of flip-flop 418 is coupled to one side of transmission gate 419, the other side of which is coupled to a second input of multiplexer 410 as intermediate signal F2.

Figure 5B:
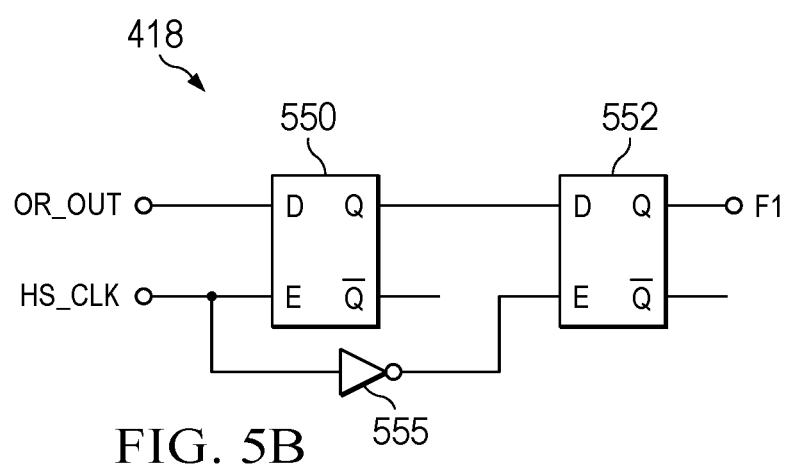
FIG. 5B is an electrical diagram, in schematic form, of a D-type flip-flop circuit in the duty cycle correction circuit of FIG. 4 according to an example embodiment.

FIG. 5B illustrates an example of D-type edge-triggered flip-flop 418 according to this example implementation. Other alternative implementations of D-type edge-triggered flip-flop 418 are also contemplated, in each such case configured and operable to store and output, while triggered by an edge or transition of reference clock HS_CLK (in the example of FIG. 4, a falling edge of HS_CLK), a logic level corresponding to the level at its D input, which in this case is signal OR_OUT.

In the example of FIG. 5B, flip-flop 418 is constructed in master-slave fashion, with master latch 550 and slave latch 552 each constructed as a D-type latch with an enable input (e.g., similarly as described above relative to FIG. 5A). The D input of master latch 550 is coupled to the output of OR gate 414 to receive signal OR_OUT, and the enable input of master latch 550 receives reference clock HS_CLK. The Q (positive) output of master latch 550 is coupled to the D input of slave latch 552. The enable input of slave latch 552 receives reference clock HS_CLK, inverted by inverter 555. The Q output of slave latch 552 serves as the output of flip-flop 416, and presents signal F1 based on the state of slave latch 552.

In the operation of this example implementation of flip-flop 418, during positive phases of reference clock HS_CLK (e.g., HS_CLK at a high logic level), master latch 550 of flip-flop 418 latches the instantaneous state of signal OR_OUT. Accordingly, the Q output of master latch 550 will respond to transitions of signal OR_OUT that occur during positive phases of reference clock HS_CLK. At and after a falling edge (high-to-low transition) of reference clock HS_CLK, master latch 550 will be disabled from responding to signal OR_OUT. Meanwhile, slave latch 552 is enabled by the low level of reference clock HS_CLK (via inverter 555) to latch the state at the Q output of master latch 550, and to present that signal level at its output as signal F1. Because master latch 550 is disabled from further response to signal OR_OUT during the negative phase of reference clock HS_CLK, the state at its Q output as of the falling edge of reference clock HS_CLK will be retained by slave latch 552 at its Q output for the duration of this negative HS_CLK phase. In this manner, flip-flop 418 is edge-triggered by the falling edge of reference clock HS_CLK.

Other alternative implementations of D-type edge-triggered flip-flop 418 are also contemplated, in each such case configured and operable to latch and output, in response to a transition of reference clock HS_CLK is at a given level (e.g., a falling edge), a logic level corresponding to the level at an input coupled to receive signal OR_OUT.

Referring back to FIG. 4, the output of latch 412, which presents delayed signal R1D, is coupled to a D input of D-type edge-triggered flip flop 420. Flip-flop 420 may be constructed in the same manner as flip flop 418 described above, with its clock input coupled to DPLL 302 to receive reference clock HS_CLK. In this example implementation, flip-flop 420 is edge-triggered by the falling edge of reference clock HS_CLK to present a signal CONTROL at its output corresponding to the level of delayed signal IUD at the time of a falling edge of reference clock HS_CLK.

In the implementation of FIG. 4, the output of flip-flop 420 is coupled to a control input of transmission gate 419 and to an input of inverter 421, which has its output coupled to a control input of transmission gate 417. Transmission gates 417, 419 may each be constructed in the conventional manner, for example as parallel complementary-gated p-channel and n-channel metal oxide semiconductor (MOS) transistors, in which case the control inputs of transmission gates 417, 419 would correspond to gate electrodes of these parallel transistors. In some examples, the source of a p-channel MOS (PMOS) device is connected to the drain of an n-channel MOS (NMOS) device, and the drain of the PMOS device is connected to the source of the NMOS device. A control signal may be inverted and applied to the gate of the PMOS device while the non-inverted control signal is applied to the gate of the NMOS device. The one transmission terminal is located at the NMOS source/PMOS drain and the other is located at the NMOS drain/PMOS source. In operation, transmission gates 417, 419 may operate as a bilateral switch, where, when conducting, a signal may flow in either direction through the transmission terminals.

Flip-flop 420, together with transmission gates 417, 419 and inverter 421, provide a gate function 425 that controls the selection of signal F1_LATCH at the output of latch 416 or intermediate signal F1 at the output of flip-flop 418 to be forwarded to multiplexer 410 as intermediate signal F2. In this example, this selection is made by gate function 425 in response to the phase of delayed signal R1D as latched by edge-triggered flip-flop 420 and output as signal CONTROL. In this example, transmission gates 417 and 419 are controlled by signal CONTROL in complementary fashion through the action of inverter 421, with transmission gate 417 turned on while transmission gate 419 is turned off, and vice versa. For purposes of this description, transmission gate 417 will be turned on and transmission gate 419 turned off by a low level of signal CONTROL at the output of flip-flop 420, and transmission gate 419 will be turned on and transmission gate 417 turned off by a high level of signal CONTROL at the output of flip-flop 420. In other words, intermediate signal F2 will correspond to signal F1_LATCH at the output of latch 416 while signal CONTROL is at a low logic level, and intermediate signal F2 will correspond to signal F1 at the output of flip-flop 418 while signal CONTROL is at a high logic level in this example.

As described above, multiplexer 410 has one input coupled to buffer 406 to receive signal R2, and another input coupled to receive intermediate signal F2 from the one of transmission gates 417 and 419 that is turned on by signal CONTROL from flip-flop 420. The select input of multiplexer 410 is coupled to DPLL 302 to receive reference clock HS_CLK, and the output of multiplexer 410 presents output clock PLLCLK. In this example, multiplexer 410 forwards the level of signal R2 from the output of flip-flop 406 as output clock PLLCLK during negative phases of reference clock HS_CLK (at a low or "0" level) and forwards intermediate signal F2 as output clock PLLCLK during positive phases of reference clock HS_CLK (at a high or "1" level).

It is of course contemplated that duty cycle correction circuit 305 may alternatively be implemented in various modifications and other implementations from that described above. For example, the logic level polarities of the various signals communicated in duty cycle correction circuit 305, and correspondingly the logic implementations of its logic components, may vary from those described and shown in the accompanying figures. Furthermore, the clocking and synchronous operation of the logic functions, etc., may vary from that described above. It is contemplated that such alternatives, modifications, and variations are within the scope of the aspects described.

Figure 6:
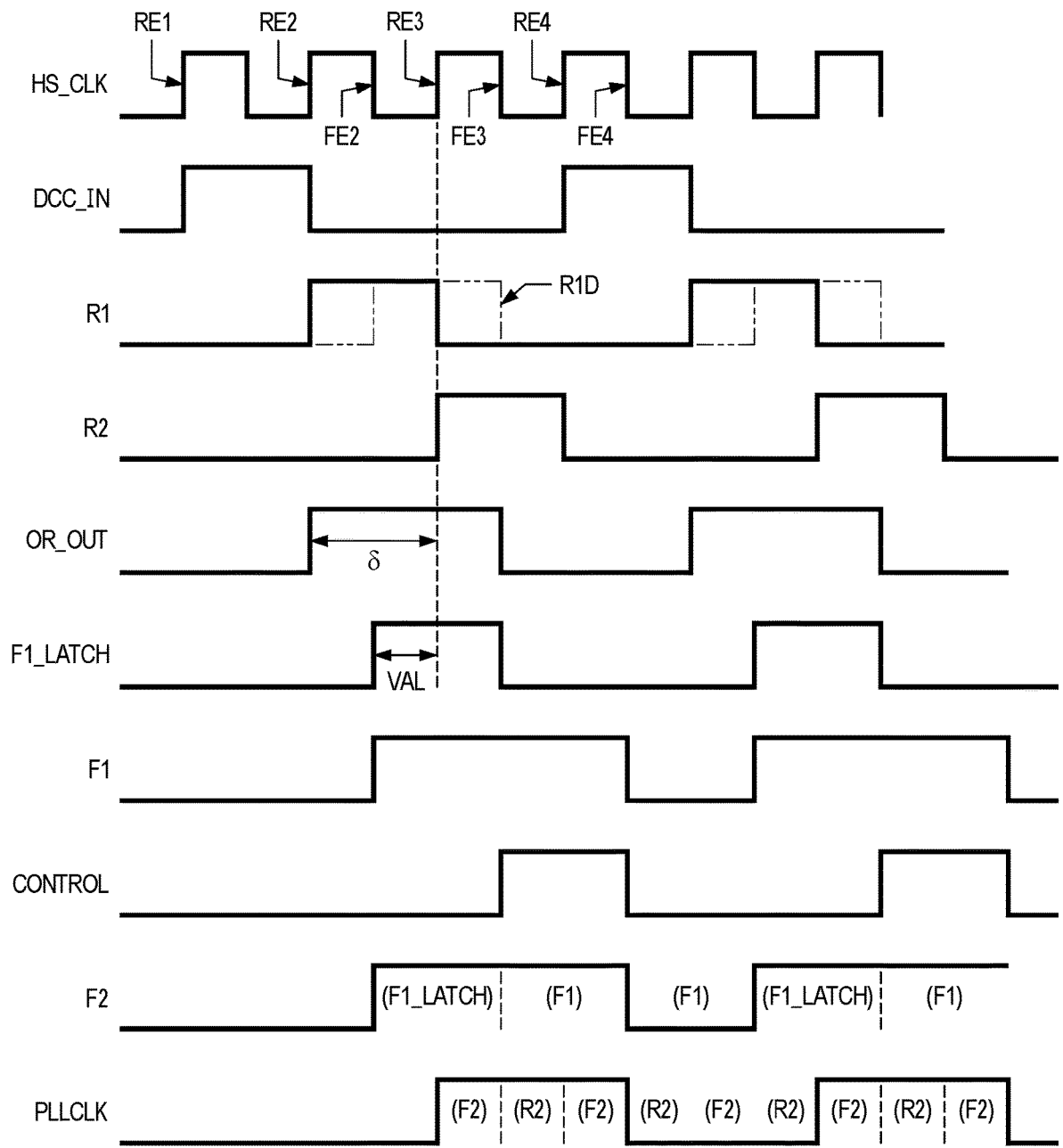
FIG. 6 is a timing diagram illustrating the operation of the duty cycle correction circuit according to an example embodiment.

An example of the operation of duty cycle correction circuit 305 of FIG. 4 for the case of an odd-valued divide ratio of 3 applied by frequency divider 304 is illustrated in the timing diagram of FIG. 6. This divide ratio of 3 causes the duty cycle of clock DCC_IN to be 33%, namely at a high logic level for two half-cycles of reference clock HS_CLK followed by a low logic level for four half-cycles, and so on.

In this odd-valued divide ratio case, control signal EVEN/ODD* is at a low logic level. Signal R1 output by clocked buffer 404 corresponds to clock DCC_IN delayed by one cycle of reference clock HS_CLK, and signal R2 output by clocked buffer 406 corresponds to clock DCC_IN delayed by two cycles of reference clock HS_CLK (e.g., signal R1 delayed by one cycle of HS_CLK). Latch 412 latches the state of signal R1 during each negative phase of reference clock HS_CLK, and thus generates delayed signal IUD corresponding to signal R1 delayed by one half-cycle of reference clock HS_CLK. OR gate 414 presents a high level at its output, as signal OR_OUT, in response to either or both of signal R1 and delayed signal IUD at a high level, such that signal OR_OUT is at a high level for the duration of the high level of signal R1, extended by one half-cycle of reference clock HS_CLK.

As described above, signal OR_OUT at the output of OR gate 414 is applied to the D inputs of latch 416 and flip-flop 418. In response to the signal OR_OUT at a high level at or after the falling edge FE2 of reference clock HS_CLK, latch 416 latches that high level of signal OR_OUT, and presents a corresponding high level at its output as signal F1_LATCH. Because reference clock HS_CLK serves as an enable signal to D-type latch 416, latch 416 will respond to the low-to-high transition of signal OR_OUT even if that transition occurs after falling edge FE2. Accordingly, the timing of the transition of signal OR_OUT is valid so long as it occurs prior to rising edge RE3 of reference clock HS_CLK, at which time latch 416 is disabled. Upon the next falling edge FE3 of reference clock HS_CLK, latch 416 is again enabled, driving signal F1_LATCH at its output to a low level in response to a high-to-low transition of signal OR_OUT.

In contrast, flip-flop 418 is edge-triggered by a falling edge of reference clock HS_CLK. Accordingly, if signal OR_OUT is at a high level as of falling edge FE2, flip-flop 418 will latch that high level, and will maintain a high level at its output (signal F1) until the next falling edge of reference clock HS_CLK, even if signal OR_OUT makes a transition, as shown in the example of FIG. 6. Since signal OR_OUT does not make its high-to-low transition until the time of falling edge FE3 or later, the high level of signal OR_OUT will remain latched at flip-flop 418 until falling edge FE4.

In the example of FIG. 6, signal CONTROL is at a low logic level at the time of falling edge FE2, until making a transition in response to a high-to-low transition of signal R1D at falling edge FE3. In the HS_CLK cycle from falling edge FE2 to falling edge FE3, transmission gate 417 is on (and transmission gate 419 is off), such that intermediate signal F2 corresponds to the state of latch 416, namely signal F1_LATCH. At falling edge FE3, signal CONTROL goes to a high level, selecting signal F1 at the output of flip-flop 418 for intermediate signal F2 applied to multiplexer 410, at least until the next falling edge FE4. In the half-cycle between rising edge RE3 and falling edge FE3, multiplexer 410 passes intermediate signal F2 to its output as output clock PLLCLK, and in the half-cycle between falling edge FE3 and rising edge RE4, multiplexer selects signal R2 from buffer 406 for output clock PLLCLK. And in the half-cycle between rising edge RE4 and falling edge FE4, multiplexer 410 outputs intermediate signal F2 as output clock PLLCLK, which has remained at a high level because flip-flop 418 retains its latched state until falling edge FE4 as described above.

Accordingly, output clock PLLCLK is at a high level for three successive half-cycles, from rising edge RE3 to falling edge FE4 in this example. Following falling edge FE4, duty cycle correction circuit 305 operates in the same manner, except to present a low logic level as output clock PLLCLK for three-half cycles. Accordingly, duty cycle correction circuit 305 has corrected the duty cycle of clock DCC_IN to a duty cycle of 50% at output clock PLLCLK, while maintaining the same frequency.

For the case in which the divide ratio applied by frequency divider 304 is even-valued, control signal EVEN/ODD* will be at a high logic level, which forces latch 412 into a reset condition such that its output (signal R1D) remains at a low logic level unconditionally. This low level of signal MD is maintained by flip-flop 420, such that signal CONTROL is at a low level throughout the operation of duty cycle correction circuit 305 at this divide ratio. Transmission gate 419 is never turned on as a result, effectively eliminating flip-flop 418 from the signal path generating output clock PLLCLK. Input clock DCC_IN is thus effectively passed through latch 416, generating intermediate signal F2 that is essentially synchronous with signal R2 from clocked buffer 406. No duty cycle correction is thus applied as a result.

Duty cycle correction circuit 305 according to this example embodiment relaxes the timing constraints on the propagation of the input clock DCC_IN, in correcting the duty cycle of odd-valued frequency divider ratios to 50%. As noted above, latch 416 allows the valid transition of signal OR_OUT to occur over a full cycle of reference clock HS_CLK (e.g., from rising edge RE2 to rising edge RE3), while flip-flop 418 holds the high logic level of signal OR_OUT for a full cycle after rising edge RE3. Accordingly, the delay δ of the rising edge of signal OR_OUT, for example including a propagation delay $t_{clk\_q}$ of buffer 404 and also the propagation delay $t_{OR}$ of OR gate 414, plus any setup time $t_{su}$ at latch 416 can be as long as a full cycle of reference clock HS_CLK. The limiting signal path of duty cycle correction circuit 305 is thus referred to as a "full-cycle" path, in that the critical timings must be accounted for within a full cycle of the reference clock HS_CLK.

Figure 1A:
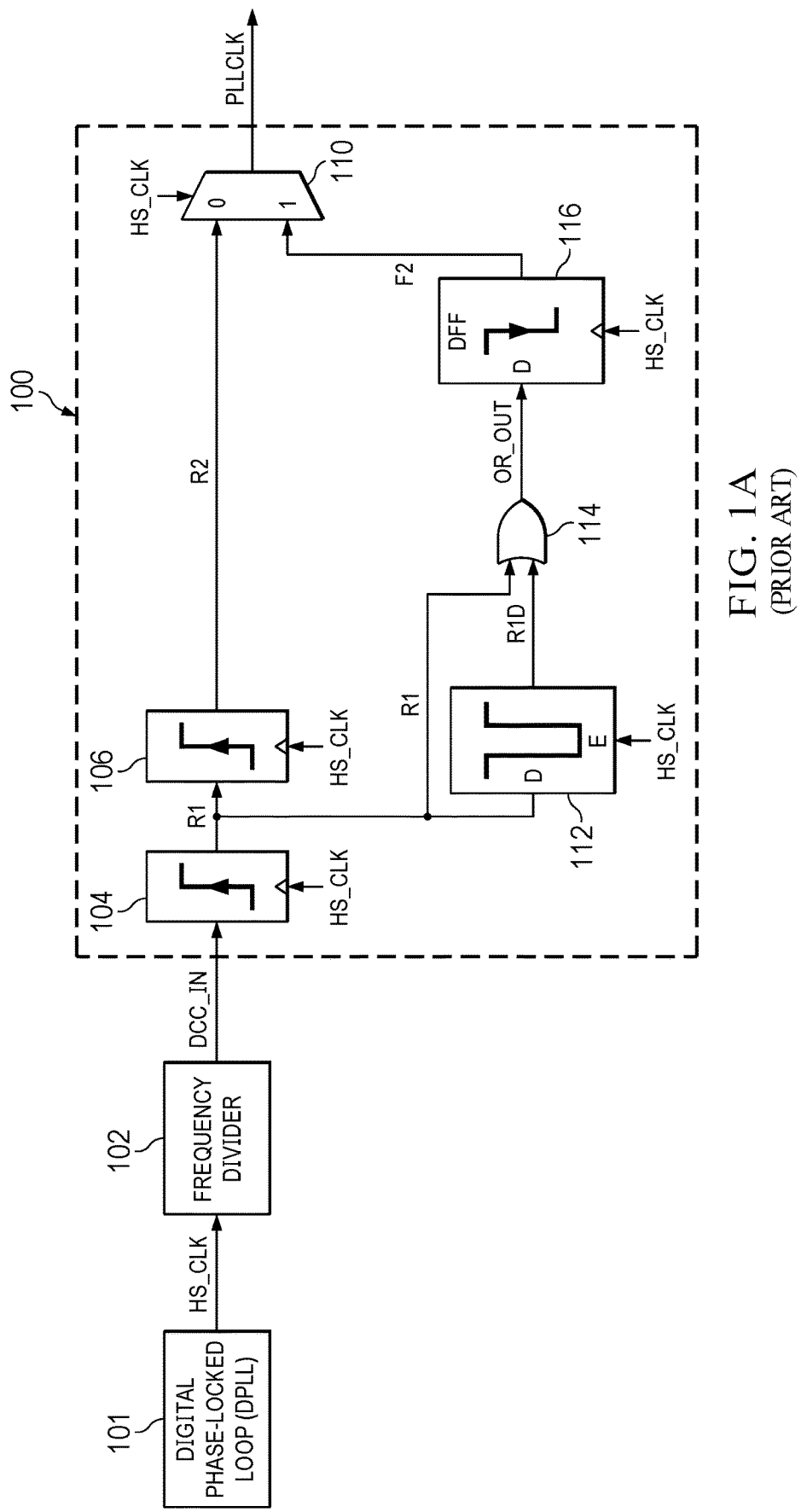
FIG. 1A is an electrical diagram, in block form, of a conventional duty cycle correction circuit.
Figure 1B:
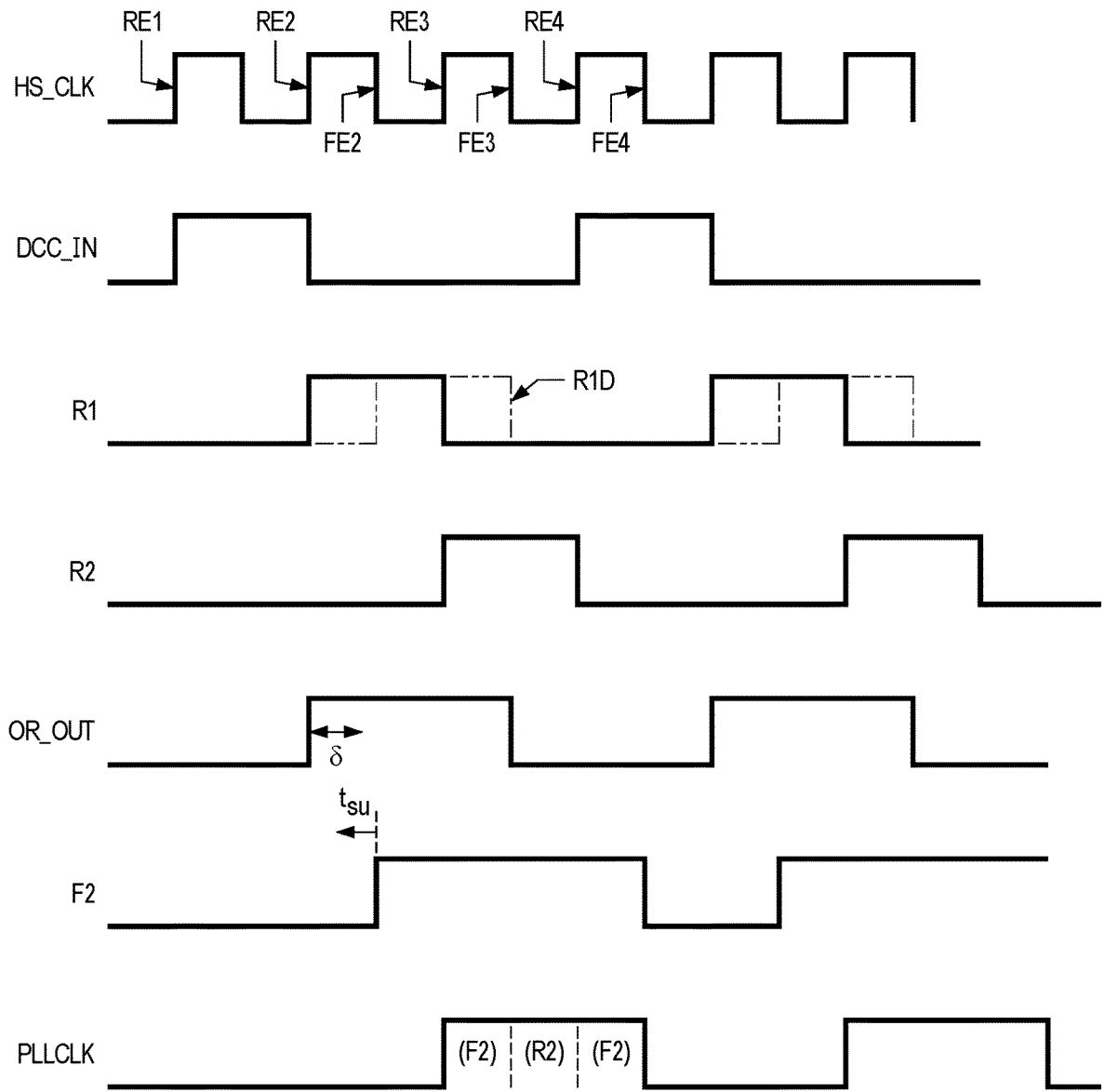
FIG. 1B is a timing diagram illustrating the operation of the conventional duty cycle correction circuit of FIG. 1A.

This full-cycle path in duty cycle correction circuit 305 according to this example embodiment enables reference clock HS_CLK to operate at a higher frequency than in the half-cycle path permitted by conventional circuits (e.g., as described above relative to FIGS. 1A and 1B). For example, if the relevant circuit elements of the circuit have a propagation delay $t_{clk\_q}$ of 20 psec and a propagation delay $t_{OR}$ of 25 psec, plus a flip-flop setup time $t_{su}$ of 10 psec, the full-cycle period of reference clock HS_CLK can be as short as 55 psec, corresponding to a maximum frequency of 18.2 GHz, prior to applying design margin for aging and other performance effects. In addition to this significant improvement in maximum clock frequency, the duty cycle correction circuit according to this example embodiment operates at a very low noise level, ensuring accurate high-speed operation.

Figure 7:
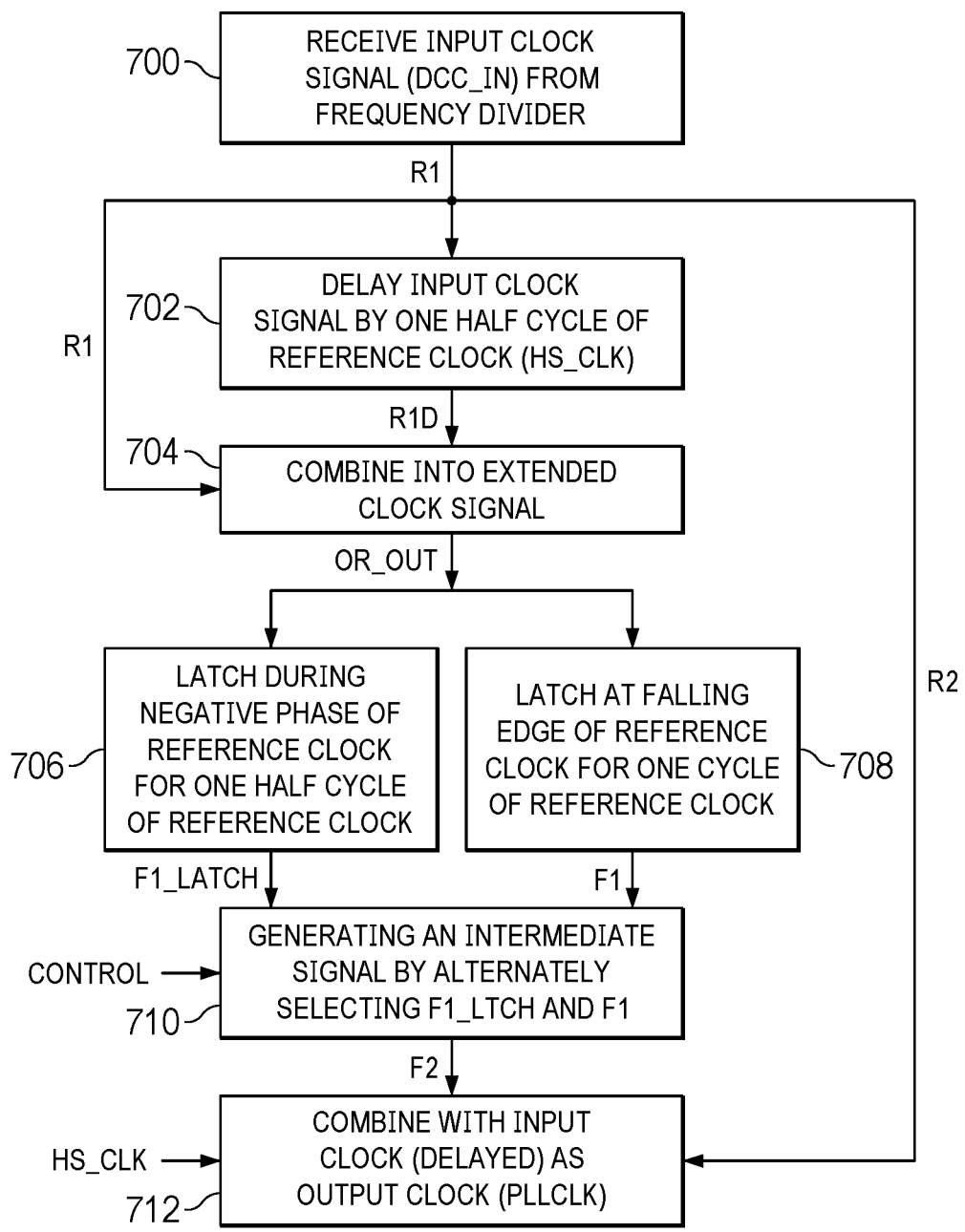
FIG. 7 is a flow diagram illustrating the operation of a method of correcting the duty cycle of an input clock signal according to an example embodiment.

The flow diagram of FIG. 7 illustrates a method of correcting the duty cycle of an input clock signal, such as input clock DCC_IN, according to an example embodiment. This example method can be performed by duty cycle correction circuitry, such as exemplified by duty cycle correction circuit 305 of FIG. 4 and described above.

An input clock signal DCC_IN is received by duty cycle correction circuit 305 from frequency divider 304 in process 700. As noted above, this input clock DCC_IN is at a frequency divided down from that of a reference clock HS_CLK by an odd-valued divide ratio, and thus the duty cycle of input clock DCC_IN is not 50% as desired for the output clock PLLCLK. This example of FIG. 7 will be described for the case in which the positive (high) phase within each period of input clock DCC_IN is shorter than its negative (low) phase by a duration corresponding to one cycle of reference clock HS_CLK. Of course, duty cycle correction according to this example implementation may be equivalently applied to correct the duty cycle in which the negative phase is longer than the positive phase, with the appropriate change to the polarity of the logic in duty cycle correction circuit 305.

In process 702, a delayed version of input clock DCC_IN is generated by a delay stage. In the example described above, process 702 is performed by latch 412 relative to signal R1 from clocked buffer 404. Signal R1 is itself a delayed version of input clock DCC_IN (at the same frequency and duty cycle), because buffer 404 is clocked by a rising edge of reference clock HS_CLK. Latch 412 generates delayed signal R1D, delayed by one half-cycle of reference clock HS_CLK relative to signal R1.

In process 704, the delayed signal MD is combined with signal R1 (corresponding to input clock DCC_IN) to form an extended clock signal, which in this example is a signal at the same frequency as input clock DCC_IN but with its positive phase extended by one half-cycle of reference clock HS_CLK. In the example of duty cycle correction circuit 305, process 704 is performed by OR gate 414, which generates its output signal OR_OUT as the logical OR of signal R1 and delayed signal R1D.

The combined signal OR_OUT is then applied to parallel processes 706 and 708 in this example. In process 706 according to this example, signal OR_OUT is latched (e.g., by D-type latch 416) during the negative phase of reference clock HS_CLK. More specifically, as described above, latch 416 operates to latch and output the state of signal OR_OUT at the D input of latch 416 while reference clock HS_CLK is at a low logic level; the state of signal OR_OUT as of the rising edge of reference clock HS_CLK is then retained for the next half-cycle (e.g., positive phase) of reference clock HS_CLK. As described above, this allows a valid state of the positive phase of signal OR_OUT to be attained at any point within that negative phase of reference clock HS_CLK. In the example of FIG. 4 and FIG. 6, the output of latch 416 and thus of this process 706 is shown as signal F1_LATCH.

Meanwhile, in process 708, D-type edge-triggered flip-flop 718 operates to latch the state of signal OR_OUT in response to a falling edge of reference clock HS_CLK, and to retain that latched state at its output (e.g., as signal F1 in FIG. 4 and FIG. 6) for a full cycle of reference clock HS_CLK, until the next falling edge of HS_CLK. As shown in FIG. 6, signal F1 remains at a high level after signal F1_LATCH returns to a low level (e.g., until falling edge FE4 in FIG. 6).

In process 710, intermediate signal F2 is generated by alternating between the two latched signals F1_LATCH (from latch 416) and F1 (from flip-flop 718). In the example of FIG. 4, process 710 is performed by gate function 425, in its complementary control of transmission gates 417, 419 in response to signal CONTROL from flip-flop 420. Given the operation of processes 706 and 708, the positive phase of signal F1_LATCH is available before that of signal F1, while signal F1 remains at a high level for a full cycle of reference clock HS_CLK after signal F1_LATCH has returned low. Accordingly, process 710 generates signal F2 first from signal F1_LATCH and then from signal F1.

In process 712, output clock PLLCLK is generated from intermediate signal F2. In the example of FIG. 4 and FIG. 6, process 712 is performed by multiplexer 410 alternating between signal F2 and signal R2 (which corresponds to signal R1 delayed by one cycle of reference clock HS_CLK by clocked buffer 406). According to this implementation, output clock PLLCLK has the same frequency as input clock DCC_IN but at 50% duty cycle.

In the event that the duty cycle of input clock signal DCC_IN is 50% as received (e.g., as generated by a frequency divider dividing down the frequency of the reference clock HS_CLK by an even-valued integer divide ratio), processes 704 and 708 in the method of FIG. 7 can be omitted (e.g., inhibited from being performed, or their results ignored). In this case, the delayed version of the input clock signal can flow through processes 706, 710, and 712 to simply pass through the duty cycle correction circuitry without change (other than delay).

The method of FIG. 7 similarly enables duty cycle correction with the same advantages as described above, including the providing of relaxed timing by providing a "full-cycle" data path (e.g., the latching of process 706) for the critical timing of the rising edge of signal OR_OUT. As described above, this full-cycle path enables use of a reference clock HS_CLK at a higher frequency than in conventional duty cycle correction. In addition, this enabling of a higher maximum clock frequency can be attained with a very low noise level in the operating circuitry, as noted above.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value or, if the value is zero, a reasonable range of values around zero. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A duty cycle correction circuit operable to receive, at a circuit input, an input clock signal having a frequency divided down from a reference clock by an odd-valued integer value, the duty cycle correction circuit comprising:
- a delay stage, having a first input operable to receive the reference clock and a second input coupled to the circuit input, the delay stage configured to output, at an output of the delay stage, a delayed clock signal corresponding to the input clock signal delayed by one half-cycle of the reference clock;
- a logic circuit, having a first input coupled to the circuit input and a second input coupled to the output of the delay stage, the logic circuit configured to output, at an output of the logic function, an extended clock signal corresponding to a logical OR of the input clock signal and the delayed clock signal;
- a latch circuit, having an input coupled to the output of the logic circuit and an enable input operable to receive the reference clock, the latch circuit configured to latch the state of the extended clock signal when enabled by the reference clock, and to output its latched state at an output of the latch circuit;
- a flip-flop, having a data input coupled to the output of the logic function, and a clock input operable to receive the reference clock, the flip-flop configured to latch the state at its data input responsive to a selected transition of the reference clock and to output its latched state at an output of the flip-flop;
- a gate circuit configured to selectively couple, to an output of the gate circuit, a selected one of the output of the latch and the output of the flip-flop responsive to a state of the delayed clock signal; and
- a multiplexer, having a first input coupled to the circuit input, a second input coupled to the output of the gate circuit, and a select input operable to receive the reference clock, the multiplexer configured to select its first and second inputs, in alternating phases of the reference clock, for output as an output clock signal.

2. The duty cycle correction circuit of claim 1, further comprising:
- a first clocked buffer having an input coupled to the circuit input, a clock input operable to receive the reference clock, and an output coupled to the first input of the delay stage; and
- a second clocked buffer having an input coupled to the output of the first clocked buffer, a clock input operable to receive the reference clock, and an output coupled to the first input of the multiplexer.

3. The duty cycle correction circuit of claim 2, wherein the logic circuit comprises an OR gate having a first input coupled to the output of the first clocked buffer, a second input coupled to the output of the delay stage, and an output coupled to the input of the latch circuit and the data input of the flip-flop.

4. The duty cycle correction circuit of claim 1, wherein the latch circuit is a first latch circuit;
and wherein the delay stage comprises:
- a second latch circuit having a first input coupled to the circuit input, an enable input operable to receive the reference clock, and an output coupled to the second input of the logic circuit.

5. The duty cycle correction circuit of claim 4, wherein the flip-flop is a first flip-flop;
wherein the gate circuit comprises:
- a second flip-flop, having a data input coupled to the output of the delay stage, a clock input operable to receive the reference clock, and an output;
- a first transmission gate, coupled between the output of the first flip-flop and the second input of the multiplexer, and having a control input coupled to the output of the second flip-flop; and
- a second transmission gate, coupled between the output of the latch circuit and the second input of the multiplexer, and having a control input coupled to the output of the second flip-flop in complementary fashion relative to the first transmission gate.

6. The duty cycle correction circuit of claim 5, wherein the second latch circuit is an R—S type latch, wherein the first input of the second latch circuit is a set input, and wherein the second latch circuit further has a reset input operable to receive a control signal.

7. The duty cycle correction circuit of claim 6, wherein the input clock signal may be at a frequency divided down from the reference clock by either an even-valued integer value or an odd-valued integer value;
wherein the control signal received at the reset input of the second latch circuit is at an active level if the input clock signal is at a frequency divided down from the reference clock by an even-valued integer value;
and wherein the control signal received at the reset input of the second latch circuit is at an inactive level if the input clock signal is at a frequency divided down from the reference clock by an odd-valued integer value.

8. Clock circuitry, comprising:
reference clock circuitry configured to output a reference clock at an output of the reference clock circuitry;
a frequency divider, having an input coupled to the output of the reference clock circuitry and configured to generate, at an output of the frequency divider, an input clock signal having a frequency divided down from the frequency of the reference clock by an odd-valued integer;
a duty cycle correction circuit, having an input coupled to the output of the frequency divider and configured to output an output clock signal at an output of the duty cycle correction circuit; and
at least one clock generator circuit, having an input coupled to the output of the duty cycle correction circuit, the at least one clock generator circuit configured to generate one or more clock signals based on the output clock signal from the duty cycle correction circuit;
wherein the duty cycle correction circuit comprises:
- a circuit input receiving the input clock signal;
- a delay stage, having a first input operable to receive the reference clock and a second input coupled to the circuit input, the delay stage configured to output, at an output of the delay stage, a delayed clock signal corresponding to the input clock signal delayed by one half-cycle of the reference clock;
- a logic circuit, having a first input coupled to the circuit input and a second input coupled to the output of the delay stage, the logic circuit configured to output, at an output of the logic circuit, an extended clock signal corresponding to a logical OR of the input clock signal and the delayed clock signal;
- a latch circuit, having an input coupled to the output of the logic circuit and an enable input operable to receive the reference clock, the latch circuit configured to latch the state of the extended clock signal when enabled by the reference clock, and to output its latched state at an output of the latch circuit;

a flip-flop, having a data input coupled to the output of the logic circuit, and a clock input operable to receive the reference clock, the flip-flop configured to latch the state at its data input responsive to a selected transition of the reference clock and to output its latched state at an output of the flip-flop;

a gate circuit configured to selectively couple, to an output of the gate circuit, a selected one of the output of the latch and the output of the flip-flop responsive to a state of the delayed clock signal; and a multiplexer, having a first input coupled to the circuit input, a second input coupled to the output of the gate circuit, a select input operable to receive the reference clock, and an output coupled to the output of the duty cycle correction circuit, the multiplexer configured to select its first and second inputs, in alternating phases of the reference clock, for application at the output of the multiplexer.

9. The clock circuitry of claim 8, wherein the duty cycle correction circuit further comprises:

a first clocked buffer having an input coupled to the circuit input, a clock input operable to receive the reference clock, and an output coupled to the first input of the delay stage; and a second clocked buffer having an input coupled to the output of the first clocked buffer, a clock input operable to receive the reference clock, and an output coupled to the first input of the multiplexer.

10. The clock circuitry of claim 9, wherein the logic circuit comprises an OR gate having a first input coupled to the output of the first clocked buffer, a second input coupled to the output of the delay stage, and an output coupled to the input of the latch circuit and the data input of the flip-flop.

11. The clock circuitry of claim 8, wherein the latch circuit is a first latch circuit;

and wherein the delay stage comprises:
a second latch circuit having a first input coupled to the circuit input, an enable input operable to receive the reference clock, and an output coupled to the second input of the logic circuit.

12. The clock circuitry of claim 11, wherein the flip-flop is a first flip-flop;

wherein the gate circuit comprises:
a second flip-flop, having a data input coupled to the output of the delay stage, a clock input operable to receive the reference clock, and an output;
a first transmission gate, coupled between the output of the first flip-flop and the second input of the multiplexer, and having a control input coupled to the output of the second flip-flop; and
a second transmission gate, coupled between the output of the latch circuit and the second input of the multiplexer, and having a control input coupled to the output of the second flip-flop in complementary fashion relative to the first transmission gate.

13. The clock circuitry of claim 12, wherein the second latch circuit is an R—S type latch, wherein the first input of the second latch circuit is a set input, and wherein the second latch circuit further has a reset input operable to receive a control signal.

14. The clock circuitry of claim 13, wherein the input clock signal may be at a frequency divided down from the reference clock by either an even-valued integer value or an odd-valued integer value;

wherein the control signal received at the reset input of the second latch circuit is at an active level if the input clock signal is at a frequency divided down from the reference clock by an even-valued integer value;

and wherein the control signal received at the reset input of the second latch circuit is at an inactive level if the input clock signal is at a frequency divided down from the reference clock by an odd-valued integer value.

15. A duty cycle correction method, comprising:

receiving an input clock signal having a frequency divided down from the frequency of a reference clock by an odd-valued integer;

delaying the input clock signal by a half-cycle of the reference clock to produce a delayed signal;

combining the input clock signal with the delayed signal to produce an extended clock signal;

latching, by a latch circuit, the extended clock signal during a first phase of the reference clock, and outputting a latched state of the latch circuit during a second phase of the reference clock;

latching, by an edge-triggered flip-flop, the extended clock signal responsive to a transition of the reference clock to the first phase, and outputting a latched state of the flip-flop until a next transition of the reference clock to the first phase;

generating an intermediate signal by alternately selecting between the output of the latch circuit and the output of the flip-flop; and generating an output clock using the intermediate signal.

16. The method of claim 15, further comprising:

buffering the input clock signal at a first clocked buffer, the first clocked buffer clocked by the reference clock;

wherein the combining step combines the input clock signal from an output of the first clocked buffer with the delayed signal to produce the extended clock signal.

17. The method of claim 16, further comprising:

buffering a signal from the output of the first clocked buffer at a second clocked buffer, the second clocked buffer clocked by the reference clock;

wherein the step of generating the output clock comprises:
combining the intermediate signal with a signal at an output of the second clocked buffer in alternating phases of the reference clock to produce the output clock.

18. The method of claim 15, wherein the combining step comprises:

performing a logical OR of the input clock signal and the delayed signal to produce the extended clock signal.

19. The method of claim 15, further comprising:

receiving a signal from a frequency divider indicating whether the input clock signal has a frequency divided down from the frequency of the reference clock by an odd-valued integer or an even-valued integer;

wherein the combining step and the step of latching the extended clock signal are performed responsive to the signal indicating an odd-valued integer;

and wherein the combining step and the step of latching the extended clock signal are omitted responsive to the signal indicating an even-valued integer.

* * * * *